United States Patent [19]

Lax

[11] Patent Number: 4,921,467
[45] Date of Patent: May 1, 1990

[54] LOCAL OSCILLATORS FOR RADIO RECEIVERS

[75] Inventor: Alexander P. Lax, Freienbach, Switzerland

[73] Assignee: Multitone Electronics PLC, United Kingdom

[21] Appl. No.: 200,598

[22] Filed: May 31, 1988

[30] Foreign Application Priority Data

Jun. 2, 1987 [GB] United Kingdom ............... 8712856

[51] Int. Cl.$^5$ .................. H03B 1/00; G04B 17/12
[52] U.S. Cl. ................................... 455/264; 331/176;
331/177 R; 368/200
[58] Field of Search ............... 455/255, 257, 258, 264,
455/186, 317, 184, 192, 316; 331/176, 66, 69,
70, 1 R, 10, 25, 177 R; 368/200, 202; 364/557;
324/79 R

[56] References Cited

U.S. PATENT DOCUMENTS

| | | | |
|---|---|---|---|
| 4,513,259 | 4/1985 | Frerking | 331/176 |
| 4,611,181 | 9/1986 | Fukumura et al. | 331/176 |
| 4,633,422 | 12/1986 | Brauer | 331/176 |
| 4,646,035 | 2/1987 | Chapelle | 331/177 R |

FOREIGN PATENT DOCUMENTS 0149404 12/1984 European Pat. Off.
0193629 11/1984 Japan ................... 331/176

*Primary Examiner*—Reinhard J. Eisenzopf
*Assistant Examiner*—Curtis A. Kuntz
*Attorney, Agent, or Firm*—Renner, Otto, Boisselle & Sklar

[57] ABSTRACT

A local oscillator for a radio receiver includes a voltage controlled oscillator (VCO), a decoder and controller for providing a control voltage to the VCO, an error detector circuit for detecting an error in the frequency of the VCO on the basis of a received signal processed with the oscillating signal from the VCO, a temperature probe and a memory. The local oscillator is initially set up during manufacture by detecting any errors in the frequency at selected temperatures, and storing data in the memory indicative of the control voltage required to compensate for the frequency error for each temperature. In operation the decoder and controller applies the appropriate control voltage to the VCO on the basis of the data stored in the memory relative to the temperature detected by the temperature probe. If, for example as a result of ageing of the oscillator, the error detector detects an error in the frequency, the decoder and controller adjusts the control voltage to the VCO so as to compensate for the error, and the updated value is stored in the memory for subsequent use. If the received signal is mixed with the oscillating signal in a mixer, the output of intermediate frequency stages can be used for error detection. Alternatively, demodulated data can be used for this purpose, for example in a direct conversion receiver.

18 Claims, 2 Drawing Sheets

LOCAL OSCILLATORS FOR RADIO RECEIVERS

BACKGROUND OF THE INVENTION

1. Field of the Invention

This invention relates to local oscillators for radio receivers, and to methods of controlling and adjusting such local oscillators.

2. Description of the Prior Art

In certain types of radio receiver, it is necessary to provide a local oscillator with very high stability, namely an oscillator which will maintain its frequency characteristics without drift. One example of such a requirement arises in relation to radio-paging receivers. In such cases, a crystal oscillator has generally been utilized and this will typically provide stability down to about 5 ppm. However, even this order of stability is sometimes insufficient. Variations in the characteristic frequency of a crystal oscillator arise as a result of changes in the ambient temperature. Accordingly, it has previously been proposed to measure the performance of a crystal oscillator with variation in temperature, and then to construct a control unit to provide compensation for the oscillator so as to stabilize its frequency. In one proposal, a voltage-controlled oscillator is provided together with a temperature detector, and the control unit is adjusted so as to provide a control voltage to the oscillator depending on the detected temperature such that the oscillator frequency is maintained constant, the control voltage for each temperature having been derived by testing during manufacture. This technique can be slow and expensive. Moreover, since it relies on a single test procedure during manufacture when the crystal oscillator is new, it cannot take account of ageing effects as a result of which the oscillator performance will drift from its original frequency characteristics over time. Thus, the performance of a radio receiver incorporating a local oscillator of this type will deteriorate over time.

SUMMARY OF THE INVENTION

Accordingly, it is an object of the invention to provide a local oscillator for a radio receiver, and a method of controlling such an oscillator, in which compensation for frequency errors can be readily achieved.

It is a further object of the invention to provide a local oscillator for a radio receiver, and a method of controlling such an oscillator, which can allow for ageing effects which otherwise would cause the original frequency characteristics to drift.

It is a still further object of the invention to provide a method of adjusting a local oscillator so as to minimize the frequency compensation necessary in normal use.

According to one aspect of the invention there is provided a local oscillator for a radio receiver, the local oscillator comprising a voltage controlled oscillator for generating an oscillating signal at a nominal required frequency, control means responsive to a temperature-dependent signal to select data from a memory in accordance with the temperaturedependent signal and to generate a control voltage for the voltage controlled oscillator according to the selected data, and means for detecting an error in the frequency of the oscillating signal from the voltage controlled oscillator on the basis of a received signal which has been processed with the oscillating signal in the radio receiver, wherein, when the error detecting means detects a frequency error, the control means is operable to adjust the control voltage to the voltage controlled oscillator so as to compensate for the frequency error, and to store data relating to the adjusted control voltage and to the respective temperature-dependent signal in the memory for subsequent use.

According to a second aspect of the invention there is provided a method of controlling a local oscillator in a radio receiver, the method comprising obtaining an indication of the temperature of the local oscillator, generating a control voltage for the local oscillator on the basis of data selected from a memory, the data being selected in accordance with the obtained temperature indication, detecting an error in the frequency of the oscillating signal from the local oscillator, using a received signal which has been processed with the oscillating signal in the radio receiver, and when an error is detected, adjusting the control voltage to the local oscillator so as to compensate for the error, and storing data relating to the adjusted control voltage and to the respective temperature indication in the memory for subsequent use.

According to a third aspect of the invention there is provided a method of adjusting a local oscillator in a radio receiver, the local oscillator being as defined above or controllable according to the method defined above, the adjusting method comprising placing the radio receiver in a variable temperature enclosure and setting the temperature to a desired value, transmitting a test signal to the radio receiver, detecting an error in the frequency of the oscillating signal from the local oscillator, using the test signal which has been processed with the oscillating signal in the radio receiver, when an error is detected, adjusting the control voltage to the local oscillator so as to compensate for the error, and storing data relating to the control voltage and to the set value of temperature in the memory, and setting the temperature of the enclosure to a different value and repeating the test signal transmitting, the error detecting, the control voltage adjusting and the data storing steps.

In a preferred embodiment of the invention, to be described in greater detail hereinafter, an adaptive technique is used whereby, if stored compensation data is found to lead to incorrect frequency compensation, the control means adjusts the oscillator until the frequency compensation is correct, and the corresponding correct compensation data is then stored for subsequent use.

Error detection utilizes the received and processed radio signal to provide information to the control means which can then provide any required correction or compensation to the oscillator. This received information can be in the form of the modulated carrier, or can use some or all of the demodulated data. For example, in a frequency deviation transmission technique such as frequency-shift keyed (FSK) transmission, if data is transmitted as a frequency deviation of +4 kHz, and if it is found that the signal being received has a deviation of +3 kHz and −5 kHz, then it will be apparent that the local oscillator should be adjusted by 1 kHz in order to ensure optimum performance.

The above, and other objects, features and advantages of this invention will be apparent from the following detailed description of illustrative embodiments which is to be read in connection with the accompanying drawings.

BRIEF DESCRIPTION OF THE DRAWINGS

Referring to FIG. 1, the receiver circuit includes an antenna 10 for receiving a transmitted r.f. signal, an r.f. amplifier 12 and a bandpass filter 14 respectively for amplifying and filtering out unwanted lower and higher frequency components from the r.f. signal, a mixer or multiplier 16 for mixing the filtered r.f. signal with an oscillating signal from a local oscillator such as a voltage-controlled oscillator (VCO) 18, and one or more intermediate frequency (IF) stages 20 for amplifying and filtering the mixed signal at an intermediate frequency from the mixer 16. The IF signal from the IF stages 20 is then fed to decoding or demodulating circuitry (not shown) in conventional manner to produce a required output signal. This type of circuit is known as a superheterodyne receiver and, in certain applications, the local oscillator can include a crystal oscillator. As described previously, it has been proposed to compensate for frequency drift arising from temperature variations in such oscillators by providing a temperature detector and a control unit, the control unit generating a control voltage for adjusting the frequency of the oscillator in dependence on the detected temperature, such that any frequency drift from the required frequency will be compensated for by readjustment of the frequency as a result of the control voltage. This technique requires precise calibration of the temperature/output voltage characteristic of the temperature detector and control unit, and also knowledge of the temperature-dependent frequency drift characteristic of the oscillator. Moreover, even if the circuit is constructed and adjusted to work effectively when new, long term effects such as ageing will cause this adjustment to deteriorate over time, such that the reference frequency provided to the mixer will no longer be the optimum required frequency.

Figure 1:
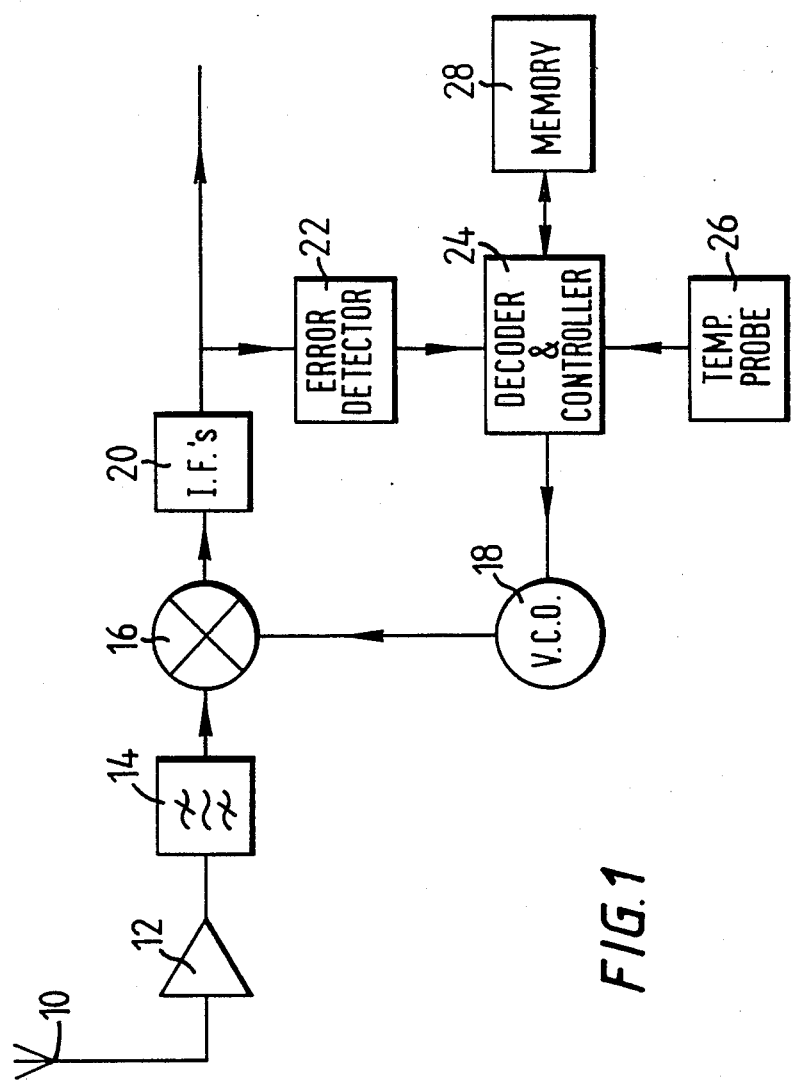
FIG. 1 is a block diagram of a receiver circuit including a high stability local oscillator according to a preferred embodiment of the present invention.

Accordingly, the preferred embodiment of the present invention also includes, as shown in FIG. 1, an error detector circuit 22 receiving the IF signal and operable to detect a frequency drift parameter in the signal, a decoder and controller 24 receiving an error detection signal from the error detector circuit 22 and a temperature signal from a temperature probe 26, and a memory 28 for storing data from and supplying stored data to the decoder and controller 24. The decoder and controller 24 is also connected to the VCO 18 so as to provide a control voltage for controlling the frequency thereof.

Operation of the circuit shown in FIG. 1 will subsequently be described with reference to FIG. 2, but first an initial adjustment technique will be described which can be implemented during manufacture. After assembly, a number of the receivers are set up at room temperature and then placed in a variable temperature enclosure. While the receivers are in this enclosure, a test signal, which in the case of paging receivers intended to be responsive to a characteristic preamble signal can be the preamble signal itself, is transmitted to the receivers so that they will remain active. In this state, the temperature is varied in the enclosure over the approximate range of interest. The error detector circuit 22 in each receiver will detect the extent of frequency drift and the decoder and controller 24 then generates an appropriate control voltage to the VCO 18 until the frequency drift has been compensated out. The memory 28 is then activated to store the required control voltage for the particular temperature (as detected by the temperature probe 26) and the process is repeated at different temperatures. This technique enables the receivers to eliminate local oscillator errors arising from temperature variations sufficiently accurately so that, during the life of the receiver, fine corrections (as will be described subsequently) will be sufficient to compensate precisely for the temperature variations, without a situation being reached such that the local oscillator frequency is too far adrift from the required frequency to cause the receiver to attempt to jump to an adjacent channel. The original calibration data should be stored in the receiver so that it can be referred to subsequently whenever necessary, such as in a situation when updated data has been degraded or lost.

The operation of the circuit after initial adjustment will now be described, with reference to the flow diagram shown in FIG. 2.

Figure 2:
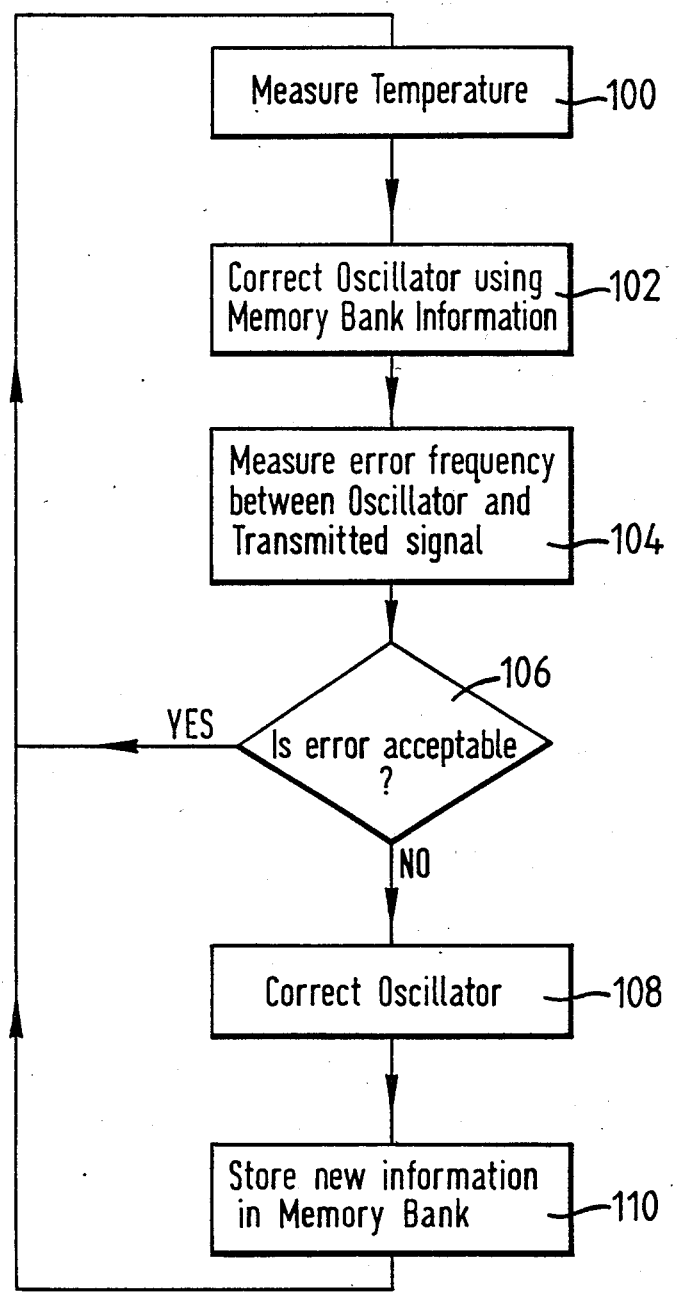
FIG. 2 is a flow diagram of the operation of the circuit shown in FIG. 1.

Referring to FIG. 2, the decoder and controller 24 receives a temperature measurement from the temperature probe 26, according to a step 100. In a step 102, the oscillator is corrected on the basis of memory bank information. In other words, the decoder and controller 24 responds to the temperature signal from the temperature probe 26 to read out an appropriate value of correction factor for that temperature from the memory 28, and to apply a corresponding control voltage to the VCO 18 so as to adjust the frequency. After the control voltage has been applied to the VCO 18, the decoder and controller 24 measures the error frequency between the VCO 18 and the transmitted signal which has been received, in a step 104. This measurement is performed on the basis of the error signal received from the error detector circuit 22. It should be noted that this error frequency is not the difference frequency, since the local oscillator frequency will be offset by the intermediate frequency value. Thus, the error frequency will be equal to the difference frequency minus the intermediate frequency. The error frequency is checked in a step 106 to see whether it lies within predetermined acceptable limits. If so, the process returns to the step 100 to perform another temperature measurement. However, if the error frequency is not within the acceptable limits, the oscillator is corrected according to a step 108. This correction is achieved in a similar manner to the adjustment during manufacture. In other words, the error detector circuit 22 in each receiver will detect the extent of frequency drift and the decoder and controller 24 will generate a control voltage for the VCO 18 until the frequency drift has been compensated out and the error signal from the error detector circuit 22 is zero or at least within the acceptable limits.

Since the fact that further correction of the control voltage to the VCO 18 was required indicates that the data in the memory 28 is no longer sufficient to provide adequate correction on its own, the new data indicating the appropriate control voltage for that particular temperature (as determined by the step 108) is written into the memory 28, as shown by a step 110. Thus, when the frequency characteristics of the oscillator change as a result of ageing or the like, the receiver circuit can compensate for this long-term change by storing new information in the memory 28, and using the updated information instead of the original information written into the memory during the manufacturing process.

Preferably, the original information should be retained rather than overwritten by the updated information, in case an incorrect updating process is implemented leading to incorrect adjustment of the oscillator such that the received signal is lost and cannot be recovered by optimization of the oscillator frequency. In that situation, the original information can be reverted to, and the compensation process can be started again. Once the new information has been stored in the memory according to the step 110, the process returns to the first step 100 to perform another temperature measurement and to proceed as described above.

Although the technique has been described with reference to a superheterodyne receiver, it will be seen that it is equally applicable to other types of receiver which require a stable local oscillator, as long as it is possible to obtain an indication of the frequency drift of the oscillator from the processed signal, so that appropriate frequency compensation can be applied. For example, in a direct conversion receiver such as may be used for an FSK (frequency-shift keyed) received signal, the information concerning oscillator frequency drift may be obtained from the output signal of the demodulator in the receiver. In the case of a balanced transmission, since the average modulation level is always the same, the demodulated output signal (or at least a time-averaged version thereof) can be used as a direct measure of frequency drift of the local oscillator.

In certain types of equipment, such as some paging receivers, a microprocessor is already provided for data decoding functions or the like. In some cases, the microprocessor is a standard part, whereas in others it is a specialized component which may even be integrated with other decoder components. In either case, such a microprocessor can also be used to provide the control functions for compensating the local oscillator. For temperature detection, it is sufficient to make use of any parameter which varies with temperature in a predictable manner. Thus it is possible to implement operation according to the invention in a simple and relatively inexpensive manner.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A local oscillator for a radio receiver, said local oscillator comprising:
    a voltage controlled oscillator for generating an oscillating signal at a nominal required frequency;
    a memory for storing data;
    temperature sensing means for providing a temperature-dependent signal;
    control means responsive to the temperature-dependent signal to select data from said memory in accordance with the temperature-dependent signal and to generate a control voltage for said voltage controlled oscillator according to the selected data; and
    error detecting means for detecting an error in the frequency of the oscillating signal from said voltage controlled oscillator on the basis of a received signal which has been mixed with the oscillating signal in the radio receiver; and
    wherein said control means is connected to said error detecting means and is operable when said error detecting means detects a frequency error (a) to adjust the control voltage to said voltage controlled oscillator so as to compensate for the frequency error and (b) to store data relating to the adjusted control voltage and to the respective temperature-dependent signal in said memory for subsequent use in temperature compensation, thereby to compensate for ageing effects in said voltage controlled oscillator.

2. A local oscillator according to claim 1, wherein the radio receiver includes a mixer for mixing the received signal with the oscillating signal to produce an intermediate frequency signal, said error detecting means being operable to detect an error in the frequency of the intermediate frequency signal.

3. A local oscillator according to claim 2, wherein said error detecting means is operable to detect an error if the frequency of the intermediate frequency signal is outside predetermined frequency limits.

4. A local oscillator according to claim 1, wherein the radio receiver is a direct conversion receiver including a demodulator for demodulating data in the received signal, said error detecting means being operable to detect an error in the frequency of the oscillating signal on the basis of the demodulated data.

5. A local oscillator according to claim 4, wherein said error detecting means is operable to detect an error if the frequency is outside predetermined frequency limits.

6. A local oscillator according to claim 1, wherein said error detecting means is operable to detect an error if the frequency is outside predetermined frequency limits.

7. A method of controlling a local oscillator in a radio receiver, the method comprising:
    obtaining an indication of the temperature of the local oscillator;
    generating a control voltage for the local oscillator on the basis of data selected from a memory, the data being selected in accordance with the obtained temperature indication;
    detecting an error in the frequency of the oscillating signal from the local oscillator using a received signal which has been mixed with the oscillating signal in the radio receiver; and
    when an error is detected, adjusting the control voltage to the local oscillator so as to compensate for the error, and storing data relating to the adjusted control voltage and to the respective temperature indication in the memory for subsequent use in temperature compensation, thereby to compensate for ageing effects in the voltage controlled oscillator.

8. A method according to claim 7, wherein the radio receiver includes a mixer for mixing the received signal with the oscillating signal to produce an intermediate frequency signal, said error detecting step detecting an error in the frequency of the intermediate frequency signal.

9. A method according to claim 8, wherein an error is detected if the frequency of the intermediate frequency signal is outside predetermined frequency limits.

10. A method according to claim 7, wherein the radio receiver is a direct conversion receiver including a demodulator for demodulating data in the received signal, said error detecting step detecting an error in the frequency of the oscillating signal on the basis of the demodulated data.

11. A method according to claim 10, wherein an error is detected if the frequency is outside predetermined frequency limits.

12. A method according to claim 7, wherein an error is detected if the frequency is outside predetermined frequency limits.

13. A method of adjusting a local oscillator in a radio receiver, the local oscillator comprising a voltage controlled oscillator for generating an oscillating signal at a nominal required frequency, a memory for storing data, temperature sensing means for providing a temperature-dependent signal, control means responsive to the temperature-dependent signal to select data from the memory in accordance with the temperature-dependent signal and to generate a control voltage for the voltage controlled oscillator according to the selected data, and error detecting means for detecting an error in the frequency of the oscillating signal on the basis of a received signal which has been mixed with the oscillating signal in the radio receiver, said adjusting method comprising;

placing the radio receiver in a variable temperature enclosure and setting the temperature to a desired value;

transmitting a test signal to the radio receiver;

detecting an error in the frequency of the oscillating signal from the local oscillator using the test signal which has been mixed with the oscillating signal in the radio receiver;

when an error is detected adjusting the control voltage to the local oscillator so as to compensate for the error and storing data relating to the control voltage and to the set value of temperature in the memory; and setting the temperature of the enclosure to a different value and repeating said test signal transmitting, said error detecting, said control voltage adjusting and said data storing steps.

14. A method according to claim 13, wherein the radio receiver includes a mixer for mixing the receiver signal with the oscillating signal to produce an intermediate frequency signal, and said error detecting step includes detecting an error in the frequency of the intermediate frequency signal.

15. A method according to claim 14, wherein an error is detected if the frequency of the intermediate frequency signal is outside predetermined frequency limits.

16. A method according to claim 13, wherein the radio receiver is a direct conversion receiver including a demodulator for demodulating data in the received signal, and said error detecting step includes detecting an error in the frequency of the oscillating signal on the basis of the demodulated data.

17. A method according to claim 16, wherein an error is detected if the frequency is outside predetermined frequency limits.

18. A method according to claim 13, wherein an error is detected if the frequency is outside predetermined frequency limits.

* * * * *